(12) United States Patent
Piqué et al.

(10) Patent No.: US 7,014,885 B1
(45) Date of Patent: Mar. 21, 2006

(54) DIRECT-WRITE LASER TRANSFER AND PROCESSING

(75) Inventors: Alberto Piqué, Bowie, MD (US); Raymond Auyeung, Alexandria, VA (US); James Fitzgerald, Laurel, MD (US); Douglas B. Chrisey, Bowie, MD (US); Huey-Daw Wu, Fairfax, VA (US); Paul Kydd, Lawrenceville, NJ (US); David L. Richard, Fanwood, NJ (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 245 days.

(21) Appl. No.: 09/619,442

(22) Filed: Jul. 19, 2000

Related U.S. Application Data

(60) Provisional application No. 60/144,662, filed on Jul. 19, 1999.

(51) Int. Cl.
*C23C 14/28* (2006.01)
*C23C 14/30* (2006.01)
*B05D 3/00* (2006.01)

(52) U.S. Cl. ............ 427/294; 427/553; 427/595; 427/596

(58) Field of Classification Search ........ 427/487, 427/492, 493, 508, 509, 510, 553–554, 555, 427/556, 557, 558, 559, 585, 586, 595–596, 427/597, 532
See application file for complete search history.

(56) References Cited

U.S. PATENT DOCUMENTS 3,745,586 A  *  7/1973  Braudy ................... 347/253
4,401,992 A  *  8/1983  Vorst et al. ............ 346/135.1
4,716,270 A  * 12/1987  Gnanamuthu et al. . 219/121.85
4,859,279 A       8/1989  Baeuerle ................ 156/656
4,970,196 A  * 11/1990  Kim et al. .................. 505/1
5,052,102 A  * 10/1991  Fong et al. ................ 29/840
5,164,565 A  * 11/1992  Addiego et al. ...... 219/121.68
5,220,044 A  *  6/1993  Baum et al. ............. 556/40
5,246,745 A       9/1993  Baum et al. ............ 427/586
5,278,138 A       1/1994  Ott et al. .................. 505/1
5,292,559 A  *  3/1994  Joyce et al. ............. 427/597

(Continued)

OTHER PUBLICATIONS

Detig, et al., The Electrostatic Printing of Microstructures for Flat Panel Displays and Printed Wiring Boards, International Conference on Digital Printing Technologies, [NO] 15, Oct. 1999, pp. 293-296.

*Primary Examiner*—Timothy Meeks
*Assistant Examiner*—Eric B. Fuller
(74) *Attorney, Agent, or Firm*—John J. Karasek; Joseph T. Grunkemeyer

(57) ABSTRACT

A device and method for depositing a material of interest onto a receiving substrate includes a first laser and a second laser, a receiving substrate, and a target substrate. The target substrate comprises a laser transparent support having a back surface and a front surface. The front surface has a coating that comprises the source material, which is a material that can be transformed into the material of interest. The first laser can be positioned in relation to the target substrate so that a laser beam is directed through the back surface of the target substrate and through the laser-transparent support to strike the coating at a defined location with sufficient energy to remove and lift the source material from the surface of the support. The receiving substrate can be positioned in a spaced relation to the target substrate so that the source material is deposited at a defined location on the receiving substrate. The second laser is then positioned to strike the deposited source material to transform the source material into the material of interest.

19 Claims, 1 Drawing Sheet

U.S. PATENT DOCUMENTS

| | | | |
|---|---|---|---|
| 5,308,737 A * | 5/1994 | Bills et al. | 430/201 |
| 5,358,743 A | 10/1994 | Hampden-Smith et al. | 427/282 |
| 5,376,428 A * | 12/1994 | Palazzotto et al. | 428/143 |
| 5,439,502 A | 8/1995 | Kodas et al. | 75/365 |
| 5,459,098 A | 10/1995 | Maya | 437/173 |
| 5,616,165 A | 4/1997 | Glicksman et al. | 75/369 |
| 5,656,329 A | 8/1997 | Hampden-Smith et al. | 427/226 |
| 5,882,722 A | 3/1999 | Kydd | 427/123 |
| 6,099,626 A * | 8/2000 | Hirano et al. | 106/31.32 |
| 6,159,832 A * | 12/2000 | Mayer | 438/584 |
| 6,177,151 B1 * | 1/2001 | Chrisey et al. | 427/596 |
| 6,238,847 B1 * | 5/2001 | Axtell et al. | 430/322 |

* cited by examiner

DIRECT-WRITE LASER TRANSFER AND PROCESSING

This application claims the benefit of U.S. Provisional Application No. 60/144,662, filed Jul. 19, 1999.

BACKGROUND OF THE INVENTION

1. Field of the Invention

The invention relates generally to the deposition of materials and more specifically, to devices, materials and methods for direct writing of a source material onto a substrate using a first laser and then transforming the source material into a material of interest by means of a second laser.

2. Description of the Related Art

The term "direct write" refers generally to any technique for creating a pattern directly on a substrate, either by adding or removing material from the substrate, without the use of a mask or preexisting form. Direct write technologies have been developed in response to a need in the electronics industry for a means to rapidly prototype passive circuit elements on various substrates, especially in the mesoscopic regime, that is, electronic devices that straddle the size range between conventional microelectronics (sub-micron-range) and traditional surface mount components (10+ mm-range). (Direct writing may also be accomplished in the sub-micron range using electron beams or focused ion beams, but these techniques, because of their small scale, are not appropriate for large scale rapid prototyping.) Direct writing allows for circuits to be prototyped without iterations in photolithographic mask design and allows the rapid evaluation of the performance of circuits too difficult to accurately model. Further, direct writing allows for the size of printed circuit boards and other structures to be reduced by allowing passive circuit elements to be conformably incorporated into the structure. Direct writing can be controlled with CAD/CAM programs, thereby allowing electronic circuits to be fabricated by machinery operated by unskilled personnel or allowing designers to move quickly from a design to a working prototype. Mesoscopic direct write technologies have the potential to enable new capabilities to produce next generation applications in the mesoscopic regime. Other applications of direct write technologies in microelectronic fabrication include forming ohmic contacts, forming interconnects for circuit and photolithographic mask repair, device restructuring and customization, design and fault correction.

Currently known direct write technologies for adding materials to a substrate include ink jet printing, Micropen©, laser chemical vapor deposition (LCVD) and laser engineered nano-shaping (LENS). Currently known direct write technologies for removing material from a substrate include laser machining, laser trimming and laser drilling.

The direct writing techniques of ink jet printing, screening and Micropen® are wet techniques, that is, the material to be deposited is combined with a solvent or binder and is squirted onto a substrate. The solvent or binder must later be removed by a drying or curing process, which limits the flexibility and capability of these approaches. In addition, wet techniques are inherently limited by viscoelastic properties of the fluid in which the particles are suspended or dissolved.

In the direct writing technique known as "laser induced forward transfer" (LIFT), a pulsed laser beam is directed through a laser-transparent target substrate to strike a film of material coated on the opposite side of the target substrate. The laser vaporizes the film material as it absorbs the laser radiation and, due to the transfer of momentum, the material is removed from the target substrate and is redeposited on a receiving substrate that is placed in proximity to the target substrate. Laser induced forward transfer is typically used to transfer opaque thin films, typically metals, from a pre-coated laser transparent support, typically glass, $SiO_2$, $Al_2O_3$, $SrTiO_3$, etc., to the receiving substrate. Various methods of laser-induced forward transfer are described in, for example, the following U.S. patents and publications incorporated herein by reference: U.S. Pat. No. 4,064,205 to Landsman; U.S. Pat. No. 4,752,455 to Mayer; U.S. Pat. No. 4,895,735 to Cook; U.S. Pat. No. 5,725,706 to Thoma et al; U.S. Pat. No. 5,292,559 to Joyce, Jr. et al; U.S. Pat. No. 5,492,861 to Opower; U.S. Pat. No. 5,725,914 to Opower; U.S. Pat. No. 5,736,464 to Opower; U.S. Pat. No. 4,970,196 to Kim et al; U.S. Pat. No. 5,173,441 to Yu et al; U.S. Pat. No. 4,987,006 to Williams et al; U.S. Pat. No. 5,567,336 to Tatah; U.S. Pat. No. 4,702,958 to Itoh et al; German Patent No. 2113336 to Thomson-CSF and Bohandy et al, "Metal Deposition from a Supported Metal Film Using an Excimer Laser, J. Appl. Phys. 60 (4) 15 Aug. 1986, pp 1538–1539. Because the film material is vaporized by the action of the laser, laser induced forward transfer is inherently a homogeneous, pyrolytic technique and typically cannot be used to deposit complex crystalline, multi-component materials or materials that have a crystallization temperature well above room temperature because the resulting deposited material will be a weakly adherent amorphous coating. Moreover, because the material to be transferred is vaporized, it becomes more reactive and can more easily become degraded, oxidized or contaminated. The method is not well suited for the transfer of organic materials, since many organic materials are fragile and thermally labile and can be irreversibly damaged during deposition. Moreover, functional groups on an organic polymer can be irreversibly damaged by direct exposure to laser energy. Other disadvantages of the laser induced forward transfer technique include poor uniformity, morphology, adhesion, and resolution. Further, because of the high temperatures involved in the process, there is a danger of ablation or sputtering of the support, which can cause the incorporation of impurities in the material that is deposited on the receiving substrate. Another disadvantage of laser induced forward transfer is that it typically requires that the coating of the material to be transferred be a thin coating, generally less that 1 $\mu$m thick. Because of this requirement, it is very time-consuming to transfer more than very small amounts of material.

In a simple variation of the laser induced forward deposition technique, the target substrate is coated with several layers of materials. The outermost layer, that is, the layer closest to the receiving substrate, consists of the material to be deposited and the innermost layer consists of a material that absorbs laser energy and becomes vaporized, causing the outermost layer to be propelled against the receiving substrate. Variations of this technique are described in, for example, the following U.S. patents and publications incorporated herein by reference: U.S. Pat. No. 5,171,650 to Ellis et al, U.S. Pat. No. 5,256,506 to Ellis et al, U.S. Pat. No. 4,987,006 to Williams et al, U.S. Pat. No. 5,156,938 to Foley et al and Tolbert et al, "Laser Ablation Transfer Imaging Using Picosecond Optical pulses: Ultra-High Speed, Lower Threshold and High Resolution" Journal of Imaging Science and Technology, Vol. 37, No. 5, September/October 1993 pp. 485–489. A disadvantage of this method is that, because of the multiple layers, it is difficult or impossible to achieve the high degree of homogeneity of deposited material on the receiving substrate required, for example, for the construction of electronic devices, sensing devices or passivation coatings.

The direct write technique called laser chemical vapor deposition (LCVD) utilizes a laser beam focused on the surface of a substrate to induce localized chemical reactions. Usually the surface of the substrate is coated with a metal-organic precursor, which is either pyrolyzed or photolyzed locally where the laser beam scans. Pyrolytic laser CVD involves essentially the same mechanism and chemistry as conventional thermal CVD, and it has found major use in direct writing of thin films for semiconductor applications. In photolytic CVD, the chemical reaction is induced by the interaction between the laser light and the precursors. A limitation of both processes is that they must be carried out under controlled atmospheres such as inside a vacuum system and they tend to exhibit slow deposition rates. In addition, they are not well suited for direct write applications where multilayers of dissimilar materials need to be produced.

The direct write technique called LENS, utilizes a laser beam to melt powders of various materials as they come in contact with the substrate surface. LENS is a process that works well for making thick layers of metals, however, the high melting points exhibited by most ceramics required the use of high power laser beams that cause overheating of the substrate and surrounding layers. Furthermore, many ceramics once melted will not exhibit their original crystalline structure after solidification. In addition, because the materials being deposited must first melt and then resolidify, the layers are under large stresses which can cause their delamination.

A direct write method of laser transfer of certain types of materials is described in U.S. patent application Ser. No. 09/318,134 for "MATRIX ASSISTED PULSED LASER EVAPORATION DIRECT WRITE" filed on May 25, 1999 by Chrisey et al.

There are some materials that are easier to transfer in a precursor state or as a mixture of a precursor and a powdered form, but when they are transferred in this form, they do not have desired physical properties such as electrical conductance. In order to optimize desired qualities such as electrical conductance, further processing of the materials is necessary. Therefore, there is a strong need for devices and methods for transferring materials in a precursor form under ambient conditions (that is, atmospheric pressure and room temperature), and then transforming the precursor into a more useful or desirable form.

SUMMARY OF THE INVENTION

It is an object of the present invention to provide devices, materials and methods for creating a deposit of a material of interest on a substrate wherein a precursor to the material is deposited which can immediately be transformed into the material of interest.

It is an object of the present invention to provide a device and method for creating deposits of metals, dielectrics, ferroelectrics, ferrites and phosphors.

It is an object of the present invention to provide a device and method that is useful for creating a deposit of electrically conducting material by depositing a precursor material or a mixture of a precursor material and an inorganic powder that is transformed into an electrical conductor.

It is an object of the present invention to provide a device and method that allows for laser transfer and laser processing of a material to occur in sequential steps.

These and other objects are achieved by a device and method for creating a deposit of a material of interest on a receiving substrate, the device comprising a first laser and second laser, a receiving substrate, and a target substrate. The target substrate comprises a laser transparent support that has a source material coated on a front surface. The first laser can be positioned so that a laser beam from the first laser can be directed through the back surface of the target substrate and through the laser-transparent support to strike the coating at a defined location with sufficient energy to remove or lift the source material from the surface of the support. The receiving substrate can be positioned in a spaced relation to the target substrate so that the source material is deposited at a defined location on the receiving substrate. The second laser is then positioned to strike the deposited source material to transform the source material into the material of interest.

BRIEF DESCRIPTION OF THE DRAWINGS

A more complete appreciation of the invention will be readily obtained by reference to the following Description of the preferred Embodiments and the accompanying drawings.

DETAILED DESCRIPTION OF THE PREFERRED EMBODIMENTS

Figure 1A:
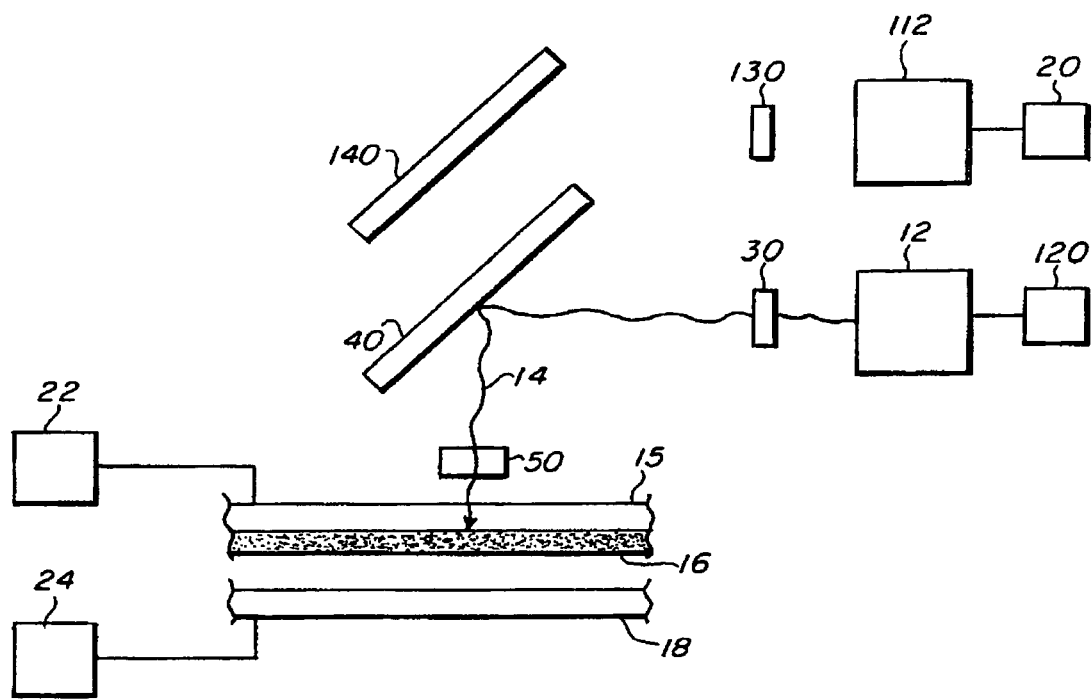
FIG. 1a is a schematic representation of the apparatus of the present invention during the operation of the first laser.
Figure 1B:
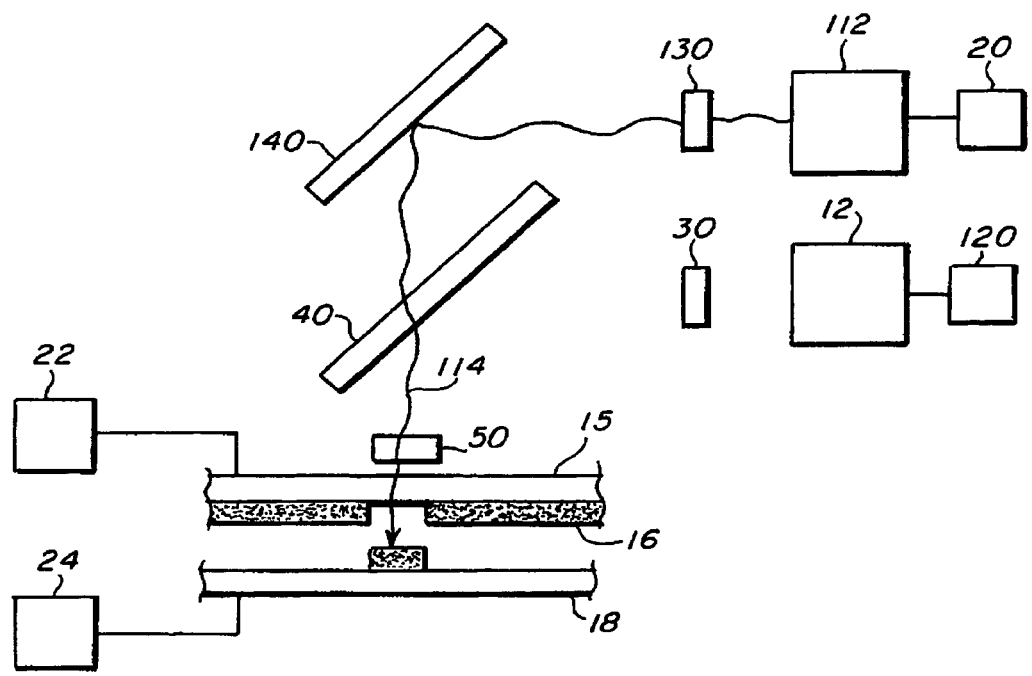
FIG. 1b is a schematic representation of the apparatus of the present invention during the operation of the second laser.

As schematically illustrated in FIGS. 1a and 1b, the apparatus of the present invention includes a first laser 12, a second laser 112, a target substrate having a laser transparent support 15 and a coating 16, and a receiving substrate 18. As shown schematically in FIG. 1a, the first laser is positioned so that as it emits a laser beam 14, the beam takes an optical path so that it travels through the back surface of the target substrate and through the laser transparent support 15 to strike the coating 16, which comprises a source material. The receiving substrate 18 is positioned so that when the source material is removed from the target substrate by the action of the laser beam, the source material is deposited on the receiving substrate. As shown schematically in FIG. 1b, the second laser is positioned so that as it emits a laser beam 114, the beam takes an optical path so that it travels through the laser transparent support and strikes a deposit 116 of the source material on the substrate. The first laser, the second laser, the target substrate and the receiving substrate are connected to first laser positioning means 20, second laser positioning means 120, target substrate positioning means 22 and receiving substrate positioning means 24, respectively. As discussed below, the apparatus may also include first laser shuttering means 30 and second laser shuttering means 130, reflective means 40 and 140 and an objective 50.

Preferably, the first laser and the second laser are copropagating or coaxial, that is, they use substantially the same optical pathway. Preferably, the apparatus includes shuttering means, such as an electromechanical, electro-optical or electro-acoustic shuttering device to control the timing of the two laser beams and includes reflective means, such as mirrored surfaces to direct the paths of the laser beams. An objective lens serves to focus the beams onto the target substrate or through a transparent portion of the target substrate and onto the receiving substrate. However, the method of the invention could also be carried out with a second laser that does not travel through the target substrate, but rather strikes the receiving substrate directly. Further, the method of the invention could be carried out with laser pulses from a single laser source, with adjustments made in the wavelength, pulse width, relative timing, polarization and power.

The receiving substrate can be any material, planar or non-planar onto which one may wish to create a deposit. The receiving substrate may be any solid material including, but not limited to, silicon, glass, plastics, metals, and ceramics. The receiving substrate may be maintained at a constant temperature by heating or cooling, preferably in the range of −50 to 300° C. Cooling may be used to aid the adhesion of the source material to the receiving substrate. Heating may be used to accelerate or facilitate the conversion of the source material into the material of interest.

The present invention is particularly useful in creating electronic devices such as passive and active components of printed circuit boards (PCBs).

The term "source material" as used herein refers to any material that can be deposited on a receiving substrate and that can be processed or transformed by the action of a laser to give a material of interest. The source material may be a single compound or a mixture of different compounds and/or different phases, such as mixed liquids and powders. And, as used herein, what is meant by "processing" or "transforming" the source material into the material of interest is any action effected by the second laser that changes the composition or the properties of the deposited material. For example, the heating action of the second laser may cause a chemical change or decomposition of all or a portion of a source material or a change in conductivity or density in the source material. The act of transforming may also include any interaction of the source material with the substrate or with previously deposited material.

For creating deposits of metals, such as for conductor lines, any precursors commonly used in chemical vapor deposition(CVD) and laser-induced chemical vapor depositon (LCVD) may be used. Examples include, but are not limited to, metal alkoxides, metal diketonates and metal carboxalates.

The source material may also be a homogeneous mixture of a liquid organometallic and a metal powder. When this material is transferred onto the receiving substrate, the second laser acts to decompose the organometallic to form bridges connecting the grains of metal powder. Use of a liquid/powder source material allows a dramatic increase in the mass of material that can be transferred per laser shot, which results in a faster layer growth rate. The particle size of the metal powder is typically about 0.01 to about 5 microns. Specific examples of liquid organometallic/metal powder combinations include silver I 2,4-pentanedionate with silver powder, silver neodecanoate with silver powder, platinum 2,4-pentanedionate with platinum powder, indium 2,4-pentanedionate with indium powder, copper II 2,4-pentanedionate with copper powder, and indium acetylacetonate with indium powder. Further examples of materials that can be used as the source material to create conducting deposits are described in the following patents incorporated herein by reference: U.S. Pat. No. 5,358,643 to Hampden-Smith et al; U.S. Pat. No. 5,278,138 to Ott et al; U.S. Pat. No. 5,439,502 to Kodas et al; U.S. Pat. No. 5,616,165 to Glicksman et al; U.S. Pat. No. 5,656,329 to Hampden-Smith et al; U.S. Pat. No. 5,882,722 to Kydd.

For creating deposits of ceramics, such as for dielectric layers and ferroelectric and ferrite materials and phosphors, the source material may be any material that is commonly used as a precursor in sol-gel processes. For example, to make simple oxide ceramics, the source material can be a simple hydrated alkoxide. Mixed liquid-powders can be used such as, for example, aluminum isopropoxide with $Al_2O_3$ or alumina. To make a complex oxide, the source material can be, for example, a double metal alkoxide. Mixed liquid-powder combinations include barium titanium ethylhexano-isopropoxide with barium titanate powder and strontium titanium isopropoxide with strontium titanate powder.

The material of interest can be any material that one may wish to have created on a substrate in a defined pattern. Typically, the material of interest is an inorganic material (since an organic material would decompose by the action of the second laser). Examples of inorganic materials include, but are not limited to the following:

Metals, including, but not limited to silver, nickel, gold, copper, chromium, titanium, aluminum, platinum, palladium, etc., and alloys thereof;

Ceramics, including, but not limited to alumina ($Al_2O_3$), silica and other glasses, and dielectrics (see below);

Dielectrics, including, but not limited to alumina, magnesium oxide (MgO), yttrium oxide($Y_2O_3$), zirconium oxide ($ZrO_2$), cerium oxide ($CeO_2$), etc.;

Ferroelectrics, including, but not limited to barium titanate ($BaTiO_3$), strontium titanate ($SrTiO_3$), lead titanate ($PbTiO_3$), lead zirconate ($PbZrO_3$), potassium niobate ($KNbO_3$), strontium bismuth tantalate ($SrBi_2Ta_2O_9$), $(Ba,Sr)TiO3$, and solid solution stoichiometric variations thereof, etc.;

Piezoelectrics, including, but not limited to the above mentioned ferroelectrics, quartz, AlN, etc.;

Ferrites, including but not limited to yttrium iron garnet ($Y_3Fe_5O_{12}$), barium zinc ferrite ($Ba_2Zn_2Fe_{12}O_{19}$), hexagonal ferrites such as barium ferrite, spinel ferrites such as nickel zinc ferrites, manganese zinc ferrite, magnetite ($Fe_3O_4$), etc.;

Electro-optical ceramics, including, but not limited to lithium niobate ($LiNbO_3$), lithium tantalate ($LiTaO_3$), cadmiun telluride (CdTe), zinc sulfide (ZnS), etc.;

Ceramic superconductors, including, but not limited to $YBa_2Cu_3O_{7-x}$ (YBCO), $Tl_2CaBa_2Cu_3O_{12}$, $La_{1.4}Sr_{0.6}CuO_{3.1}$, BiSrCaCuO, BaKBiO, halide doped fullerines, etc.;

Chalcogenides, including, but not limited to SrS, ZnS, CaS, PbS, etc.;

Semiconductors, including, but not limited to Si, Ge, GaAs, CdTe, etc.;

Phosphors, including, but not limited to SrS:Eu, SrS:Ce, ZnS:Ag, $Y_2O_2$:Eu, $Zn_2SiO_4$:Mn, etc.; and Transparent conductive oxides, including, but not limited to indium tin oxide, zinc oxide, etc.

As described above, source materials for these materials of interest may be readily synthesized by, for example, providing an inorganic-organic precursor or combining an inorganic material in powdered form with an inorganic-organic precursor.

The source material may be applied to the front surface of the laser transparent support by any method known in the art for creating uniform coatings on a surface, including, for example, by doctor blading, roller coating, screen printing, spin coating, ink jet deposition, spin spray coating, aerosol spray deposition, electrophoretic deposition, pulsed laser deposition, matrix assisted pulsed laser evaporation, thermal evaporation, sol gel deposition, chemical vapor deposition, sedimentation and print screening. Typically, the source material will be applied to the front surface of the laser transparent substrate to form a coating that is between about 0.1 $\mu$m and about 10 $\mu$m in thickness.

The laser transparent support is typically planar, having a front surface that is coated with the source material and a back surface that can be positioned so that laser energy from the first laser can be directed through the support. The composition of the laser transparent support is selected in accordance with the particular types of laser that is used. For example, if the laser is a UV laser, the laser transparent support may be a UV-transparent material including, but not limited to fused silica or sapphire. If the laser is an IR laser, the laser transparent support may be an IR-transparent material including, but not limited to plastic, silicon, fused silica, or sapphire. Similarly, if the laser is a visible laser, the laser transparent support may be a material that is transparent in the visible range, including, but not limited to soda-lime and borosilicate glasses. Typically, the method of the present invention will involve the use of both UV and IR lasers, and the preferred laser transparent material is a material that is transparent to both.

The first laser can be any type such as is generally used with laser deposition. The laser wavelength and pulse energy are chosen so that the source material on the target substrate absorbs sufficient laser energy to result in the removal of the source material from the laser transparent support and the deposit of the source material on the receiving substrate. Typically, the particular laser is selected with regard to the absorption wavelengths of the source material. Lasers are commercially available within the full spectral range from UV to IR. Examples of suitable lasers include, but are not limited to, pulsed gas lasers such as excimer lasers, i.e. $F_2$ (157 nm), ArF (193 nm), KrF (248 nm). XeCl (308 nm), XeF (351 nm), $CO_2$, nitrogen, metal vapor, etc., pulsed solid state lasers such as Nd:YAG, Ti:Sapphire, Ruby, diode pumped, semiconductor, etc., and pulsed dye laser systems. Examples of laser wavelengths employed include the UV emissions from excimer lasers operating at 193 and 248 nm and the frequency tripled or quadrupled emission from a Nd:YAG laser operating at 355 nm or 266 nm, respectively. In this fashion the chemical source material is transferred over the surface of the receiving substrate at a defined location over an area proportional to the area illuminated on the target substrate by the laser pulse and the target substrate-receiving substrate distance. The laser energy is chosen such as to be sufficient to vaporize the first monolayers of the source material at the interface without causing the rest of the material to heat up above its decomposition temperature. Typical laser fluences utilized range from 0.01 to 1 $J/cm^2$. The second step of the process begins once the chemical source material has been transferred to the surface of the receiving substrate. A second laser pulse or beam of the same or different wavelength and with a spot size of the same or a different size as that of the first laser is fired through the transparent target substrate so it hits the source material deposited over the receiving substrate. The effect of the second laser causes the decomposition or transformation of the chemical source material into the material of interest. This second "processing" laser pulse typically requires the use of an IR laser, for example the fundamental emission from a Nd:YAG laser operating at 1064 nm with power densities of $kw/cm^2$ and with pulse lengths ranging from 10 nanoseconds to a few hundred microseconds. The second laser may also be a continuous wave laser with or without a chopper. Alternately, a longer wavelength $CO_2$ laser operating at 10.6 $\mu$m can also be used. The interval between the first transfer, and second processing laser pulses can be as short as 1 microsecond. The first laser and the second laser, as well as the target substrate and the receiving substrate can be moved independently from each other or in any type of combination in order to deposit and process the material forming any given pattern.

In addition, the receiving substrate can be heated or cooled and maintained at a constant temperature, preferably between −50 and 300° C. Heating the substrate accelerates the removal of the volatile components still present in the transferred source material and improves the mechanical and electrical properties of the material of interest.

The first laser, the second laser, the target substrate and the receiving substrate can be positioned with respect to each other and moved with respect to each other by any means known in the art for supporting a laser, target substrate and receiving substrate and moving them in a controlled and defined manner. For example, similar positioning means and moving means for a laser, target and receiving substrate are known in the fields of laser transfer deposition and laser induced forward transfer. The first laser may be positioned in any location that provides an optical path between itself and the target substrate so that sufficient laser energy can be directed to defined positions on the target substrate. The dimensions of the laser beam can be controlled by any means known in the art so that only a precisely defined area of the target substrate is exposed to the laser energy and so that only a precisely defined portion of the coating is removed. The receiving substrate should be positioned so that when the coating on the target substrate is removed, the transfer material can be deposited at a defined location on the receiving substrate. Preferably, the receiving substrate is positioned about 10 to about 100 $\mu$m from the coating on the front surface of the target substrate. The second laser may be positioned in any location that provides an optical path between itself and the receiving substrate so that only a precisely defined portion of the receiving substrate is hit by the laser beam. Typically, the second laser beam will pass through a transparent portion of the target substrate (such as an area where the coating has just been removed by the action of the first laser.) The area of the receiving substrate that is exposed to the second laser will typically be the same as the area of the deposit of source material, but it can also be made larger or smaller. For example, the area of the second laser may be adjusted so that a larger section of deposited source material resulting from successive transfers can be processed at the same time. The first laser, the second laser, target substrate, and the receiving substrate should be moveable with respect to each other so that the source material can be deposited in a pattern and then processed either immediately or subsequently. (As used herein, the terms "moving [a] with respect to [b]" or "moving [a] and [b] with respect to each other" mean that either [a] or [b] can be moved to effect a change in their relative position.)

Having described the invention, the following examples are given to illustrate specific applications of the invention, including the best mode now known to perform the invention. These specific examples are not intended to limit the scope of the invention described in this application.

EXAMPLES

Example 1

Laser Transfer and Processing of Silver (Ag)

A conducting silver line was fabricated by using a UV laser beam to first transfer the coating from a target substrate to a receiving substrate and then post-processing the transferred material with a second IR laser beam. The target substrate consisted of a UV grade fused silica disk of 2" diameter and approx. ⅛" thickness on which one side was coated with a layer of the material to be transferred. This layer consisted of Ag powder (particle size of a few microns) and a metalloorganic precursor which decomposes into a conducting specie(s) at low temperatures (less than 200° C.). The receiving substrate was a microwave-quality circuit board which has various gold electrode pads that are a few microns thick. A spacer of 25-micron thickness was used to separate the target and receiving substrates.

Silver was first transferred with a focused UV ($\lambda$=248 nm or $\lambda$=355) laser beam through the target substrate at a focal fluence of 225 mJ/cm$^2$. The spot size at the focus was 40 Jim in diameter. A line of "dots" was fabricated between 2 gold contact pads by translating both the target and receiving substrates together to expose a fresh area of the target substrate for each laser shot while the laser beam remained stationary. The distance between the laser spots was approx. one spot diameter. A pass consisted of approximately 25 dots and a total of 10 passes (superimposed on one another) was made. The target substrate was moved between each pass. After the transfers, the resistance between the gold pads as measured with an ohmmeter was infinite (>20–30 Megaohms).

Next, a flashlamp-pumped Nd:YAG laser operating at 1.064 $\mu$m at 40 Hz with no Q-switch (i.e. free-running operation) was focused onto this silver line. The pulse width of this IR laser beam was estimated to be a few hundred microseconds and the focal spot size was approx. 40 microns in diameter. The average focal power density was of the order of a few kW/cm$^2$. Six passes over the previously transferred silver line were performed with this IR beam and the measured resistance decreased after each pass. Final resistance was 10.9 ohms and the IR laser post-processing was stopped because the measured resistance began to increase. The resistance of this silver line was also measured on an impedance analyzer at 1 MHz and the calculated resistivity was approx. 100 times that of bulk silver. The color of the silver line also changed from dark (almost black) right after the UV transfer to a beige appearance after the last IR processing pass.

In another variation of this experiment, the UV laser beam (wavelength of 355 nm) and the IR processing laser beam ($\lambda$=1064 nm) were both incident on the target substrate at the same time. This was an attempt to both transfer the silver material and "process" it at the same time.

Example 2

Laser Transfer and Processing of Barium Titanate (BaTiO$_3$)

Using a method similar to that described in example 1), the ferroelectric material BaTiO$_3$ (BTO) was transferred to interdigitated capacitor structures on an MgO substrate.

The receiving substrate has interdigitated capacitors of various finger lengths and gap spacings patterned on a (500 Å)Au/(1.5 $\mu$m)Ag/(500 Å)Cr coating on an MgO substrate. The target substrate consisted of a mixture of BTO powders in a precursor agent comprising barium neodecanoate and dimethoxy titanium dineodecanaoate deposited as a layer on one side of a UV-grade fused silica disk.

The UV transfer laser wavelength was 248 nm and the focal laser fluence on the target substrate was 0.3 J/cm$^2$. The focal spot size was 40 microns in diameter. The UV laser operated at 1 Hz and the target substrate was moved after every laser shot to expose a fresh area of the BTO coating. (A 25-micron spacer was used between the target and receiving substrates). Structures such as "pads" or "dots" could be built by translating the receiving substrate. Areas of the substrate which received little or no material were "repaired" subsequently by repeated transfers over the same site.

A BTO pad was built over the fingers of the interdigitated capacitors by UV laser transfer and then a portion of it processed by an IR laser (=1064 nm). The estimated IR laser focal spot was approx. 42 microns in diameter yielding an average intensity in the kW/cm$^2$ range. The IR laser beam was allowed to remain stationary over a portion of the BTO pad for 24 sec.

Under optical microscopy, the "laser processed" portion of the BTO pad appeared more shiny and glassy than the original BTO transfer. The interdigitated capacitors were measured on an impedance analyzer near 30 GHz and the dielectric constant was approximately 30.

Obviously, many modifications and variations of the present invention are possible in light of the above teachings. It is therefore to be understood that, within the scope of the appended claims, the invention may be practiced otherwise than as specifically described.

What is claimed is:

1. A method for creating a deposit of a material of interest on a receiving substrate, the method comprising the steps of
   providing a first laser and a second laser, wherein the first laser is a pulsed laser, providing a receiving substrate,
   providing a target substrate comprising a laser-transparent support having a back surface and a front surface, wherein the front surface has a coating that comprises a source material, wherein the source material is either a single compound or a homogenous mixture of different compounds that can be transformed into the material of interest,
   positioning the first laser in relation to the target substrate and exposing the target substrate to pulsed laser energy so that the pulsed laser energy is directed through the back surface of the target substrate and through the laser-transparent support to strike the coating at a defined target location with sufficient energy to cause the source material to be removed from the surface of the support at the defined location,
   positioning the receiving substrate in a spaced relation to the target substrate so that the source material is deposited at defined receiving location on the receiving substrate, and
   positioning the second laser in relation to the receiving substrate so that laser energy strikes the deposited source material to transform the source material into the material of interest;
      wherein the first laser has an energy and wavelength chosen to vaporize one or more monolayers of the source material adjacent to the target substrate without vaporizing the rest of the source material.

2. The method of claim 1 including the further step of pretreating the receiving substrate by positioning the first laser or the second laser so that it strikes the receiving substrate before the source material is deposited thereon.

3. The method of claim 1 wherein the receiving substrate is maintained at a constant temperature of between −50° C. and 300° C.

4. The method of claim 1 wherein the source material is a homogeneous mixture of an organometallic compound and a metal powder.

5. The method of claim 1 wherein the source material is a organometallic/metal powder combination selected from the group consisting of
silver I 2,4-pentanedionate/silver;
silver neodecanoate/silver;
platinum 2,4-pentanedionate/platinum;
indium 2,4-pentanedionate/indium;
copper II 2,4-pentanedionate/copper; and
indium acetylacetonate/indium.

6. The method of claim 1 wherein the source material is a homogeneous mixture of a hydrated metal alkoxide and a metal powder.

7. The method of claim 1 wherein the source material is a hydrated metal alkoxide.

8. The method of claim 1 wherein the source material is a mixture of aluminum isopropoxide and aluminum oxide powder.

9. The method of claim 1 wherein the source material is an inorganic alkoxide/inorganic oxide mixture selected from the group consisting of barium titanium ethylhexanoisopropoxide/barium titanate powder and strontium titanium isopropoxide/strontium titanate powder.

10. The method of claim 1 wherein the source material is a mixture of one or more metal organic compounds.

11. The method of claim 1 wherein the source material is a mixture of one or more hydrated metal alkoxides.

12. The method of claim 1, wherein the second laser decomposes the source material to form the material of interest.

13. The method of claim 11, wherein a gap exists between the target substrate and the receiving substrate.

14. The method of claim 1, wherein substantially all of the deposited source material is transformed into the material of interest.

15. The method of claim 1, wherein the second laser is the fi laser, wherein one or more parameters of the first laser selected from the group consisting of wavelength, pulse width, relative timing, polarization, and power have been adjusted.

16. A method for creating a deposit of a material of interest on a receiving substrate, the method comprising the steps of
providing a target substrate comprising a laser-transparent support having a back surface and a front surface, wherein the front surface has a coating that comprises a source material, wherein the source material is either a single compound or homogenous mixture of different compounds that can be transformed into the material of interest,
providing a receiving substrate,
directing a pulsed laser beam through the back surface of the target substrate and through the laser-transparent support so that it strikes the coating at a defined target location with sufficient energy to cause the source material to be removed from the surface of the support at the defined location, and so that the source material is deposited at defined receiving location on the receiving substrate, and
directing a laser beam to strike the deposited source material to transform the source material into the material of interest;
wherein the pulsed laser beam has an energy and wavelength chosen to vaporize one or more monolayers of the source material adjacent to the target substrate without vaporizing the rest of the source material.

17. The method of claim 16, wherein in the step of directing a laser beam, the laser beam decomposes the source material to form the material of interest.

18. The method of claim 16, wherein a gap exists between the target substrate and the receiving substrate.

19. The method of claim 16, wherein substantially all of the deposited source material is transformed into the material of interest.

* * * * *